United States Patent
Zhou et al.

(10) Patent No.: US 7,090,001 B2
(45) Date of Patent: Aug. 15, 2006

(54) OPTIMIZED MULTIPLE HEAT PIPE BLOCKS FOR ELECTRONICS COOLING

(75) Inventors: Peng Zhou, Albany, CA (US); Dolf van Der Heide, San Jose, CA (US); Kenneth Goodson, Belmont, CA (US); Girish Upadhya, San Jose, CA (US)

(73) Assignee: Cooligy, Inc., Mountain View, CA (US)

( * ) Notice: Subject to any disclaimer, the term of this patent is extended or adjusted under 35 U.S.C. 154(b) by 0 days.

(21) Appl. No.: 10/440,363

(22) Filed: May 16, 2003

(65) Prior Publication Data

US 2004/0244950 A1 Dec. 9, 2004

Related U.S. Application Data

(60) Provisional application No. 60/444,269, filed on Jan. 31, 2003.

(51) Int. Cl.
*F28D 15/00* (2006.01)
*F28F 7/00* (2006.01)

(52) U.S. Cl. .............. 165/104.21; 165/80.3; 165/104.33

(58) Field of Classification Search ......... 165/104.21, 165/104.27, 104.33, 185, 146, 80.3; 361/700, 361/702, 705; 174/15.2; 257/714, 715
See application file for complete search history.

(56) References Cited

U.S. PATENT DOCUMENTS

| | | | |
|---|---|---|---|
| 596,062 A | 12/1897 | Firey | |
| 2,039,593 A | 5/1936 | Hubbuch et al. | |
| 2,273,505 A | 2/1942 | Florian | |
| 3,361,195 A | 1/1968 | Meyerhoff et al. | |
| 3,771,219 A | 11/1973 | Tuzi et al. | |
| 3,817,321 A | 6/1974 | von Cube et al. | |
| 3,948,316 A | 4/1976 | Souriau | |
| 4,109,707 A | 8/1978 | Wilson et al. | |
| 4,211,208 A | 7/1980 | Lindner | |
| 4,312,012 A | 1/1982 | Frieser et al. ............... 357/82 |
| 4,450,472 A | 5/1984 | Tuckerman et al. ......... 357/82 |
| 4,485,429 A | 11/1984 | Mittal | |
| 4,516,632 A | 5/1985 | Swift et al. ............... 165/167 |
| 4,540,115 A | 9/1985 | Hawrylo | |

(Continued)

FOREIGN PATENT DOCUMENTS

JP 62152147 A * 7/1987

(Continued)

OTHER PUBLICATIONS

"Integrally Grooved Semiconductor Chip and Heat Sink", vol. 14, No. 5, Oct. 1971, IBM Technical Disclosure Bulletin, p. 1425.

(Continued)

*Primary Examiner*—Tho Duong
(74) *Attorney, Agent, or Firm*—Haverstock & Owens LLP

(57) ABSTRACT

A plate is thermally coupled to a heat generating device and thermally coupled to two heat pipes. Each heat pipe is configured to have a predetermined boiling point temperature selected according to design criteria. One or more additional heat pipes can be coupled to the plate. A heat spreader can be in thermal contact with the heat generating device and with at least one of the heat pipes. The heat pipes can differ in outer cross-sectional dimensions depending on thermal distance position relative to the heat generating device, such that the heat pipes located a farther thermal distance from the heat generating device have smaller outer cross-sectional dimensions than the heat pipes located a shorter thermal distance from the heat generating device.

32 Claims, 3 Drawing Sheets

U.S. PATENT DOCUMENTS

| | | | | |
|---|---|---|---|---|
| 4,561,040 | A | 12/1985 | Eastman et al. | 361/385 |
| 4,567,505 | A | 1/1986 | Pease et al. | 357/81 |
| 4,573,067 | A | 2/1986 | Tuckerman et al. | 357/82 |
| 4,574,876 | A | 3/1986 | Aid | |
| 4,644,385 | A | 2/1987 | Nakanishi et al. | |
| 4,675,783 | A * | 6/1987 | Murase et al. | 361/699 |
| 4,758,926 | A | 7/1988 | Herrell et al. | 361/385 |
| 4,866,570 | A | 9/1989 | Porter | |
| 4,868,712 | A | 9/1989 | Woodman | 361/388 |
| 4,893,174 | A | 1/1990 | Yamada et al. | |
| 4,894,709 | A | 1/1990 | Phillips et al. | 357/82 |
| 4,896,719 | A | 1/1990 | O'Neill et al. | 165/170 |
| 4,908,112 | A | 3/1990 | Pace | 204/299 R |
| 4,938,280 | A | 7/1990 | Clark | 165/80.4 |
| 5,009,760 | A | 4/1991 | Zare et al. | |
| 5,016,138 | A | 5/1991 | Woodman | 361/381 |
| 5,043,797 | A | 8/1991 | Lopes | |
| 5,057,908 | A | 10/1991 | Weber | 357/81 |
| 5,070,040 | A | 12/1991 | Pankove | 437/209 |
| 5,083,194 | A | 1/1992 | Bartilson | 357/81 |
| 5,088,005 | A | 2/1992 | Ciaccio | |
| 5,095,404 | A * | 3/1992 | Chao | 361/700 |
| 5,099,311 | A | 3/1992 | Bonde et al. | 357/82 |
| 5,099,910 | A | 3/1992 | Walpole et al. | 165/80.4 |
| 5,125,451 | A | 6/1992 | Matthews | 165/80.4 |
| 5,131,233 | A | 7/1992 | Cray et al. | 62/64 |
| 5,161,089 | A | 11/1992 | Chu et al. | |
| 5,179,500 | A | 1/1993 | Koubek et al. | 361/385 |
| 5,203,401 | A | 4/1993 | Hamburgen et al. | 165/80.4 |
| 5,218,515 | A | 6/1993 | Bernhardt | 361/385 |
| 5,228,502 | A | 7/1993 | Chu et al. | |
| 5,230,564 | A | 7/1993 | Bartilson et al. | 374/178 |
| 5,232,047 | A | 8/1993 | Matthews | 165/168 |
| 5,239,200 | A | 8/1993 | Messina et al. | 257/714 |
| 5,239,443 | A | 8/1993 | Fahey et al. | |
| 5,263,251 | A | 11/1993 | Matthews | 29/840.036 |
| 5,265,670 | A | 11/1993 | Zingher | |
| 5,274,920 | A | 1/1994 | Matthews | 29/890.039 |
| 5,281,026 | A | 1/1994 | Bartilson et al. | 374/143 |
| 5,308,429 | A | 5/1994 | Bradley | |
| 5,309,319 | A | 5/1994 | Messina | 361/699 |
| 5,316,077 | A | 5/1994 | Reichard | |
| 5,317,805 | A | 6/1994 | Hoopman et al. | 29/890.03 |
| 5,325,265 | A | 6/1994 | Turlik et al. | 361/702 |
| 5,380,956 | A | 1/1995 | Loo et al. | |
| 5,383,340 | A | 1/1995 | Larson et al. | 62/259.2 |
| 5,386,143 | A | 1/1995 | Fitch | |
| 5,421,943 | A | 6/1995 | Tam et al. | |
| 5,427,174 | A | 6/1995 | Lomolino, Sr. et al. | 165/1 |
| 5,436,793 | A | 7/1995 | Sanwo et al. | 361/689 |
| 5,459,099 | A | 10/1995 | Hsu | |
| 5,490,117 | A | 2/1996 | Oda et al. | |
| 5,508,234 | A | 4/1996 | Dusablon, Sr. et al. | |
| 5,514,832 | A | 5/1996 | Dusablon, Sr. et al. | 174/15.1 |
| 5,514,906 | A | 5/1996 | Love et al. | 257/712 |
| 5,544,696 | A | 8/1996 | Leland | |
| 5,548,605 | A | 8/1996 | Benett et al. | |
| 5,575,929 | A | 11/1996 | Yu et al. | 216/10 |
| 5,585,069 | A | 12/1996 | Zanzucchi et al. | |
| 5,641,400 | A | 6/1997 | Kaltenbach et al. | 210/198.2 |
| 5,651,414 | A * | 7/1997 | Suzuki et al. | 165/104.14 |
| 5,658,831 | A | 8/1997 | Layton et al. | |
| 5,675,473 | A | 10/1997 | McDunn et al. | |
| 5,692,558 | A | 12/1997 | Hamilton et al. | 165/80.4 |
| 5,696,405 | A | 12/1997 | Weld | 257/714 |
| 5,703,536 | A | 12/1997 | Davis et al. | 330/289 |
| 5,704,416 | A | 1/1998 | Larson et al. | 165/104.33 |
| 5,727,618 | A | 3/1998 | Mundinger et al. | 165/80.4 |
| 5,740,013 | A | 4/1998 | Roesner et al. | |
| 5,763,951 | A | 6/1998 | Hamilton et al. | |
| 5,768,104 | A | 6/1998 | Salmonson et al. | |
| 5,774,779 | A | 6/1998 | Tuchinskiy | 419/2 |
| 5,800,690 | A | 9/1998 | Chow et al. | |
| 5,801,442 | A | 9/1998 | Hamilton et al. | 257/714 |
| 5,835,345 | A | 11/1998 | Staskus et al. | |
| 5,858,188 | A | 1/1999 | Soane et al. | |
| 5,863,708 | A | 1/1999 | Zanzucchi et al. | |
| 5,870,823 | A | 2/1999 | Bezama et al. | |
| 5,874,795 | A | 2/1999 | Sakamoto | |
| 5,880,524 | A | 3/1999 | Xie | |
| 5,901,037 | A | 5/1999 | Hamilton et al. | |
| 5,921,087 | A | 7/1999 | Bhatia et al. | |
| 5,936,192 | A | 8/1999 | Tauchi | |
| 5,940,270 | A | 8/1999 | Puckett | |
| 5,960,866 | A * | 10/1999 | Kimura et al. | 165/104.33 |
| 5,964,092 | A | 10/1999 | Tozuka et al. | |
| 5,965,001 | A | 10/1999 | Chow et al. | |
| 5,978,220 | A | 11/1999 | Frey et al. | |
| 5,993,750 | A | 11/1999 | Ghosh et al. | |
| 5,997,713 | A | 12/1999 | Beetz, Jr. et al. | |
| 5,998,240 | A | 12/1999 | Hamilton et al. | |
| 6,007,309 | A | 12/1999 | Hartley | |
| 6,054,034 | A | 4/2000 | Soane et al. | 204/601 |
| 6,068,752 | A | 5/2000 | Dubrow et al. | |
| 6,090,251 | A | 7/2000 | Sundberg et al. | |
| 6,096,656 | A | 8/2000 | Matzke et al. | |
| 6,100,541 | A | 8/2000 | Nagle et al. | |
| 6,101,715 | A | 8/2000 | Fuesser et al. | |
| 6,119,729 | A | 9/2000 | Oberholzer et al. | |
| 6,126,723 | A | 10/2000 | Drost et al. | |
| 6,129,145 | A | 10/2000 | Yamamoto et al. | |
| 6,129,260 | A | 10/2000 | Andrus et al. | |
| 6,131,650 | A | 10/2000 | North et al. | 165/170 |
| 6,140,860 | A | 10/2000 | Sandhu et al. | |
| 6,146,103 | A | 11/2000 | Lee et al. | |
| 6,159,353 | A | 12/2000 | West et al. | |
| 6,163,073 | A * | 12/2000 | Patel | 257/712 |
| 6,167,948 | B1 | 1/2001 | Thomas | |
| 6,174,675 | B1 | 1/2001 | Chow et al. | |
| 6,176,962 | B1 | 1/2001 | Soane et al. | |
| 6,186,660 | B1 | 2/2001 | Kopf-Sill et al. | |
| 6,206,022 | B1 | 3/2001 | Tsai et al. | |
| 6,210,986 | B1 | 4/2001 | Arnold et al. | |
| 6,216,343 | B1 | 4/2001 | Leland et al. | |
| 6,221,226 | B1 | 4/2001 | Kopf-Sill | |
| 6,234,240 | B1 | 5/2001 | Cheon | 165/80.3 |
| 6,238,538 | B1 | 5/2001 | Parce et al. | 204/600 |
| 6,253,835 | B1 | 7/2001 | Chu et al. | |
| 6,277,257 | B1 | 8/2001 | Paul et al. | 204/450 |
| 6,301,109 | B1 | 10/2001 | Chu et al. | |
| 6,313,992 | B1 | 11/2001 | Hildebrandt | |
| 6,317,326 | B1 | 11/2001 | Vogel et al. | |
| 6,321,791 | B1 | 11/2001 | Chow | |
| 6,322,753 | B1 | 11/2001 | Lindberg et al. | |
| 6,324,058 | B1 | 11/2001 | Hsiao | |
| 6,337,794 | B1 | 1/2002 | Agonafer et al. | |
| 6,351,384 | B1 | 2/2002 | Daikoku et al. | |
| 6,366,467 | B1 | 4/2002 | Patel et al. | |
| 6,388,317 | B1 | 5/2002 | Reese | 257/713 |
| 6,396,706 | B1 | 5/2002 | Wohlfarth | |
| 6,397,932 | B1 | 6/2002 | Calaman et al. | |
| 6,400,012 | B1 | 6/2002 | Miller et al. | |
| 6,406,605 | B1 | 6/2002 | Moles | |
| 6,415,860 | B1 | 7/2002 | Kelly et al. | 165/748 |
| 6,417,060 | B1 | 7/2002 | Tavkhelidze et al. | |
| 6,424,531 | B1 | 7/2002 | Bhatti et al. | |
| 6,437,981 | B1 | 8/2002 | Newton et al. | |
| 6,438,984 | B1 | 8/2002 | Novotny et al. | |
| 6,443,222 | B1 | 9/2002 | Yun et al. | |
| 6,444,461 | B1 | 9/2002 | Knapp et al. | |
| 6,457,515 | B1 | 10/2002 | Vafai et al. | |
| 6,459,581 | B1 | 10/2002 | Newton et al. | |
| 6,477,045 | B1 | 11/2002 | Wang | |
| 6,492,200 | B1 | 12/2002 | Park et al. | |

| | | | |
|---|---|---|---|
| 6,537,437 B1 | 3/2003 | Galambos et al. | |
| 6,543,521 B1 | 4/2003 | Sato et al. | |
| 6,553,253 B1 | 4/2003 | Chang | |
| 6,578,626 B1 | 6/2003 | Calaman et al. | |
| 6,581,388 B1 | 6/2003 | Novotny et al. | |
| 6,587,343 B1 | 7/2003 | Novotny et al. | |
| 6,588,498 B1 | 7/2003 | Reysin et al. | |
| 6,591,625 B1 | 7/2003 | Simon | |
| 6,600,220 B1 | 7/2003 | Barber et al. | |
| 6,606,251 B1 | 8/2003 | Kenny, Jr. et al. | |
| 6,632,655 B1 | 10/2003 | Mehta et al. | |
| 6,632,719 B1 | 10/2003 | DeBoer et al. | 438/381 |
| 6,729,383 B1 | 5/2004 | Cannell et al. | |
| 6,743,664 B1 | 6/2004 | Liang et al. | |
| 2001/0016985 A1 | 8/2001 | Insley et al. | |
| 2001/0024820 A1 | 9/2001 | Mastromatteo et al. | |
| 2001/0045270 A1 | 11/2001 | Bhatti | |
| 2001/0046703 A1 | 11/2001 | Burns et al. | |
| 2002/0075645 A1 | 6/2002 | Kitano et al. | |
| 2002/0121105 A1 | 9/2002 | McCarthy, Jr. et al. | |
| 2002/0134543 A1 | 9/2002 | Estes et al. | |
| 2003/0062149 A1 | 4/2003 | Goodson et al. | |
| 2003/0121274 A1 | 7/2003 | Wightman | |
| 2004/0040695 A1 | 3/2004 | Chesser et al. | |
| 2004/0052049 A1 | 3/2004 | Wu et al. | |
| 2004/0089008 A1 | 5/2004 | Tilton et al. | |
| 2004/0125561 A1 | 7/2004 | Gwin et al. | |
| 2004/0160741 A1 | 8/2004 | Moss et al. | |
| 2004/0188069 A1 | 9/2004 | Tomioka et al. | |

FOREIGN PATENT DOCUMENTS

| | | |
|---|---|---|
| JP | 1-256775 | 10/1989 |
| JP | 02229455 A * | 9/1990 |
| JP | H02-229455 | 9/1990 |
| JP | 03148160 A * | 6/1991 |
| JP | 06169038 A * | 6/1994 |
| JP | 10-99592 | 4/1998 |
| JP | 2001-326311 | 11/2001 |

OTHER PUBLICATIONS

R. W. Noth, "Heat Transfer from Silicon Chips and Wafers", IBM Technical Disclosure Bulletin, vol. 17, No. 12, May 1975, p. 3544.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

E. G. Loeffel et al., "Liquid Cooled Module with Compliant Membrane", IBM Technical Disclosure Bulletin, vol. 20, No. 2, Jul. 1977, pp. 673-674.

V. Y. Doo et al., Semiconductor Chip Cooling Package, IBM Technical Disclosure Bulletin, vol. 20, No. 4, Sep. 1977, pp. 1440-1441.

V. Y. Doo et al., "Method of Effective Cooling of a High Power Silicon Chip", IBM Technical Disclosure Bulletin, vol. 20, No. 4, Sep. 1977, p. 1436-1437.

H. Krumm, "Chip Cooling", IBM Technical Disclosure Bulletin, vol. 20, No. 7, Dec. 1977, p. 2728.

E. P. Damm, Jr., "Convection Cooling Apparatus", IBM Technical Disclosure Bulletin, vol. 20, No. 7, Dec. 1977, pp. 2755-2756.

C. J. Keller et al., "Jet Cooling Cup for Cooling Semiconductor Devices", IBM Technical Disclosure Bulletin, vol. 20, No. 9, Feb. 1978, pp. 3575-3576.

B. J. Ronkese, "Centerless Ceramic Package with Directly Connected Heat Sink", IBM Technical Disclosure Bulletin, vol. 20, No. 9, Feb. 1978, p. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

A. L. Pacuzzo et al., "Integrated Circuit Module Package Cooling Structure", IBM Technical Disclosure Bulletin, vol. 20, No. 10, Mar. 1978, pp. 3898-3899.

V. W. Antonetti et al., "Integrated Module Heat Exchanger", IBM Technical Disclosure Bulletin, vol. 20, No. 11A, Apr. 1978, p. 4498.

J. A. Dorler et al., "Temperature Triggerable Fluid Coupling System for Cooling Semiconductor Dies", IBM Technical Disclosure Bulletin, vol. 20, No. 11A, Apr. 1978, pp. 4386-4388.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336-4337.

P. Hwang et al., "Conduction Cooling Module", IBM Technical Disclosure Bulletin, vol. 20, No. 11A, Apr. 1978, pp. 4334-4335.

A. J. Arnold, "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

W. J. Kleinfelder et al., "Liquid-Filled Bellows Heat Sink", IBM Technical Disclosure Bulletin, vol. 21, No. 10, Mar. 1979, pp. 4125-4126.

N. P. Bailey et al., "Cooling Device for Controlled Rectifier", IBM Technical Disclosure Bulletin, vol. 21, No. 11, Apr. 1979, pp. 4609-4610.

R. P. Chrisfield et al., "Distributed Power/Thermal Control", IBM Technical Disclosure Bulletin, vol. 22, No. 3, Aug. 1979, pp. 1131-1132.

A. J. Arnold, "Structure for the Removal of Heat from an Integrated Circuit Module", IBM Technical Disclosure Bulletin, vol. 22, No. 6, Nov. 1979, pp. 2294-2296.

A. J. Arnold et al., "Heat Sink Design for Cooling Modules in a Forced Air Environment", IBM Technical Disclosure Bulletin, vol. 22, No. 6, Nov. 1979, pp. 2297-2298.

H. D. Edmonds et al., "Heat Exchange Element for Semiconductor Device Cooling", IBM Technical Disclosure Bulletin, vol. 23, No. 3, Aug. 1980, p. 1057.

J. Landrock et al., "Cooling System for Semiconductor Chips", IBM Technical Disclosure Bulletin, vol. 23, No. 4, Sep. 1980, p. 1483.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

M. J. Brady et al., "Etched Silicon Integrated Circuit Heat Sink", IBM Technical Disclosure Bulletin, vol. 27, No. 1B, Jun. 1984, p. 627.

J. R. Skobern, "Thermoelectrically Cooled Module", IBM Technical Disclose Bulletin, vol. 27, No. 1A, Jun. 1984, p. 30.

"Heat Sink Fabrication Method", IBM Technical Disclosre Bulletin, vol. 27, No. 10A, Mar. 1985, p. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

Joseph C. Tramontana, "Semiconductor Laser Body Heat Sink", Xerox Disclosure Journal, vol. 10, No. 6, Nov./Dec. 1985, pp. 379-381.

J. C. Y. Koh et al., "Heat Transfer of Microstructure for Integrated Circuits", vol. 13, 1986, Int. Comm. Heat Mass Transfer, pp. 89-98.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Circuit Module Cooling with Coaxial Bellows Providing Inlet, Outlet and Redundant Connections to Water-Cooled Element", IBM Technical Bulletin, vol. 30, No. 5, Oct. 1987, pp. 345-347.

"Cold Plate for Thermal Conduction Module with Inlet for Cooling Water Near Highest Power Chips", IBM Technical Disclosure Bulletin, vol. 30, No. 5, Oct. 1987, p. 413.

"Heat Exchanger Modules for Data Processor with Valves Operated by Pressure from Cooling Water Pump", IBM Technical Disclosure Bulletin, vol. 30, No. 5, Oct. 1987, p. 419.

"Enhanced Cooling of Thermal Conduction Module", IBM Technical Disclosure Bulletin, vol. 30, No. 5, Oct. 1987, p. 426.

"Chip Cooling Device", IBM Technical Disclosure Bulletin, vol. 30, No. 9, Feb. 1988, pp. 435-436.

"Cooling System for Chip Carrier on Card", IBM Technical Disclosure Bulletin, vol. 31, No. 4, Sep. 1988, pp. 39-40.

"Multi-Chip Package with Cooling by a Spreader Plate in Contact with a Chip Having Cylindrical Holes Mating with an Inverse Frame Providing Water Flow Within its Pins", IBM Technical Disclosure Bulletin, vol. 31, No. 5, Oct. 1988, pp. 141-142.

"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, Apr. 1989 pp. 305-306.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.

"Water-Cooled Circuit Module with Grooves Forming Water Passages Near Heat-Producing Devices", IBM Technical Disclosure Bulletin, vol. 31, No. 12, May 1989, pp. 49-50.

"Cold Plate for Thermal conduction Module with Only Peripheral Mounting Bolts, Large Surface Area Fin Inserts and Reduced Water Flow and Thermal Resistances", IBM Technical Disclosure Bulletin, vol. 31, No. 12, May 1989, p. 59.

"Circuit Package with Circulating Boiling Liquid and Local Heat Exchanger to Limit Vapor in Coolant Outlet", IBM Technical Disclosure Bulletin, vol. 31, No. 12 May 1989, p. 34.

"Means of Removing More Heat From a TCM (Or Other Liquid-Cooled Logic Package) By Reducing the Coolant Temperature", IBM Technical Disclosure Bulletin, vol. 32 No. 5A, Oct. 1989, pp. 153-154.

"Thermal Control Hardware for Accelerated Run-In Testing of Multi-Chip Modules", IBM Technical Disclosure Bulletin, vol. 32, No. 5A, Oct. 1989, p. 129-130.

Issam Mudawar et al., "Enhancement of Critical Heat Flux from High Power Microelectronic Heat Sources in a Flow Channel", Journal of Electronic Packaging, vol. 112, Sep. 1990, pp. 241-248.

J. H. Wang et al., "Thermal-Hydraulic Characteristic of Micro Heat Exchangers", DSC-vol. 32, ASME Micromechanical Sensors, Actuators, and Systems, 1991, pp. 331-339.

"Thin Heat Pipe for Cooling Components on Printed Circuit Boards", IBM Technical Disclosure Bulletin, vol. 34, No. 7B, Dec. 1991, pp. 321-322.

Snezana Konecni et al., "Convection Cooling of Microelectronic Chips", 1992, InterSociety Conference on Thermal Phenomena, pp. 138-144.

Muhammad M. Rahman et al., "Experimental Measurements of Fluid Flow and Heat Transfer in Microchannel Cooling Passages in a Chip Substrate", EEP-vol. 4-2, ASME Advances in Electronic Packages, 1993, pp. 685-692.

X. F. Peng et al., "Forced Convection and Flow Boiling Heat Transfer for Liquid Flowing Through Microchannels", vol. 36, No. 14, 1993, Int. J. Heat Mass Transfer, pp. 3421-3427.

M. B. Bowers et al., "High Flux Boiling in Low Flow Rate, Low Pressure Drop Mini-Channel and Micro-Channel Heat Sinks", vol. 37, No. 2, 1994, Int. J. Heat Mass Transfer, pp. 321-332.

"Pin Fin Array Heat Pipe Apparatus", IBM Technical Disclosure Bulletin, vol. 37, No. 09, Sep. 1994, p. 171.

X. F. Peng et al., "Heat Transfer Characteristics of Water Flowing Through Microchannels", Experimental Heat Transfer, vol. 7, No. 4, Oct.-Dec. 1994, pp. 265-283.

Shuchi Shoji et al., "Microflow devices and systems", J. Micromech. Microeng. 4 (1994), pp. 157-171, printed in the U.K.

"Miniature Heat Exchanger for Corrosive Media", IBM Technical Disclosure Bulletin, vol. 38, No. 01, Jan. 1995, pp. 55-56.

Youngcheol Joo et al., "Fabrication of Monolithic Microchannels for IC Chip Cooling", 1995, IEEE Micro Electro Mechanical Systems, pp. 362-367.

Stephen C. Jacobson et al., "Fused Quartz Substrates for Microchip Electrophoresis", Analytical Chemistry, vol. 67, No. 13, Jul. 1, 1995, pp. 2059-2063.

J. M. Cuta et al., "Fabrication and Testing of Micro-Channel Heat Exchangers", SPIE Microlithography and Metrology in Micromaching, vol. 2640, 1995, pp. 152-160.

Michael B. Kleiner et al., "High Performance Forced Air Cooling Scheme Employing Microchannel Heat Exchangers", vol. 18, No. 4, 1995, IEEE Transactions on Components, Packaging, and Manufacturing Technology-Part A, pp. 795-804.

Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.

"Self-Contained Active Heat Dissipation Device", IBM Technical Disclosure Bulletin vol. 39, No. 04, Apr. 1996, pp. 115-116.

"Forced Boiling Cooling System with Jet Enhancement for Crititical Heat Flux Extension", IBM Technical Disclosure Bulletin, vol. 39, No. 10, Oct. 1996, p. 143.

Nelson Kuan, "Experimental Evaluation of Micro Heat Exchangers Fabricated in Silicon", HTD-vol. 331, vol. 9, 1996, National Heat Transfer Conference, pp. 131-136.

G. Mohiuddin Mala et al., "Heat Transfer and Fluid Flow in Microchannels", vol. 40, No. 13, 1997, Int. J. Heat Mass transfer, pp. 3079-3088, printed in Great Britain.

John M. Waldvogel, "A Heat Transfer Enhancement Method for Forced Convection Bonded-Fin Heatsinks", Motorola, Dec. 1997, Technical Developments, pp. 158-159.

Linan Jiang et al., "A Micro-Channel Heat Sink with Integrated Temperature Sensors for Phase Transition Study", 1999, 12$^{th}$ IEEE International Conference on Micro ElectroMechanical Systems, pp. 159-164.

John M. Waldvogel, "Aluminum Silicon Carbide Phase Change Heat Spreader", Motorola, Jun. 1999, Technical Developments, pp. 226-230.

Shung-Wen Kang et al., "The Performance Test and Analysis of Silicon-Based Microchannel Heat Sink", vol. 3795, Jul. 1999, Terahertz and Gigahertz Photonics, pp. 259-270.

Lung-Jieh Yang et al., "A Micro Fluidic System of Micro Channels with On-Site Sensors by Silicon Bulk Micromachining", vol. 3877, Sep. 1999, Microfluidic Devices and Systems II, pp. 267-272.

Linan Jiang et al., "Fabrication and Characterization of a Microsystem for a Micro-Scale Heat Transfer Study", J. Micromech. Microeng, vol. 9, No. 4 (1999) pp. 422-428, printed in the U.K.

Jerry K. Keska Ph. D. et al., "An Experimental Study on an Enhanced Microchannel Heat Sink for Microelectronics Applications", EEP-vol. 26-2, vol. 2, Advances in Electronic Packaging, 1999, pp. 1235-1259.

Muhammad Mustafizur Rahman, "Measurements of Heat Transfer in Microchannel Heat Sinks", Int. Comm. Heat Mass Transfer, vol. 27, No. 4, May 2000, pp. 495-506.

E. W. Kreutz et al., "Simulation of Micro-Channel Heat Sinks for Optoelectronic Microsystems", Microelectronics Journal, vol. 31, 2000, pp. 787-790.

A. Rostami et al., "Liquid Flow and Heat Transfer in Microchannels: a Review", vol. 18, No. 2, 2000, Heat and Technology, pp. 59-68.

Sarah Arulanandam et al., "Liquid Transport in Rectangular Microchannels by Electroosmotic Pumping", Colloids and Surfaces A: Physicochemical and Engineering Aspects 161 (2000), pp. 89-102.

Gad Hetsroni et al., "Nonuniform Temperature Distribution in Electronic Devices Cooled by Flow in Parallel Microchannels", IEEE Transactions on Components and Packaging Technologies, vol. 24, No. 1, Mar. 2001, pp. 16-23.

Linan Jiang et al., "Forced Convection Boiling in a Microchannel Heat Sink", Journal of Microelectromechanical Systems, vol. 10, No. 1, Mar. 2001, pp. 80-87.

"Autonomous displacement of a solution in a microchannel by another solution", Research Disclosure, Jun. 2001, pp. 1046-1047.

Angela Rasmussen et al., "Fabrication Techniques to Realize CMOS-Compatible Microfluidic Microchannels", Journal of Microelectromechanical, vol. 10, No. 2, Jun. 2001, pp. 286-297.

James P. Slupe et al., "An Idea for Maintaining a Stable Thermal Environment for Electronic Devices", Research Disclosure, Aug. 2001, p. 1312.

Yongendra Joshi, "Heat Out of Small Packages", Dec. 2001, Mechanical Engineering, pp. 56-58.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Kendra V. Sharp et al., "Liquid Flows in Microchannels", The MEMS Handbook, vol. 6, 2002, pp. 6-1 to 6-38.

* cited by examiner

DETAILED DESCRIPTION OF THE PREFERRED
OPTIMIZED MULTIPLE HEAT PIPE BLOCKS FOR ELECTRONICS COOLING

This application claims priority under 35 U.S.C. § 119(e) of the co-pending U.S. provisional patent application Ser. No. 60/444,269, filed on Jan. 31, 2003, and titled "REMEDIES FOR FREEZING IN CLOSED-LOOP LIQUID COOLING FOR ELECTRONIC DEVICES." The provisional patent application Ser. No. 60/444,269, filed on Jan. 31, 2003, and titled "REMEDIES FOR FREEZING IN CLOSED-LOOP LIQUID COOLING FOR ELECTRONIC DEVICES" is hereby incorporated by reference.

FIELD OF THE INVENTION

The present invention generally relates to a method of and apparatus for removing heat from a heat source, in which boiling temperatures of heat pipes are optimized to ensure that the heat pipes start to boil at approximately the same heat load condition from the chip, thereby utilizing the full heat removal capacity of the heat pipes.

BACKGROUND OF THE INVENTION

The increasing power of electronic devices is motivating the semiconductor industry to seek effective thermal management solutions. A number of techniques for cooling electronic devices and packages have become widespread. Currently, fin array heat sinks with fans are the most common cooling technique. These devices are typically attached to a package lid or directly to a die. A primary purpose of heat sinks is to increase the area for heat rejection to air.

Another common technique that has emerged in the past decade is the use of heat pipes. The heat pipe has become a widely used thermal management tool in the notebook industry. Most current notebooks utilize heat pipes in their thermal management solution. Their primary purpose is to remove heat from a heat source to a heat sink where the heat is dissipated. Heat pipes are vacuum-tight vessels that are evacuated and partially filled with a small amount of water or other working fluid with a wicking structure. FIG. 1 shows an illustration of how a heat pipe works. As heat is directed into a heat pipe 110 from a heat source 120, fluid evaporates creating a pressure gradient in the heat pipe 110. This forces vapor 130 to flow along the heat pipe 110 to a cooler section or condenser 160 where it condenses. The condensed fluid wicks 140 back to the evaporator 150 near the heat source 120.

Heat removal capacity of the heat pipe is controlled by wicking media and heat pipe geometry, among which important parameters are heat pipe cross-sectional dimensions and heat pipe length. Currently, available heat pipes with 6 cm outer diameter (OD) can only dissipate about 30 to 50 W of heat. High performance electronic devices often dissipate more than 100 W of heat. Therefore, multiple heat pipes are used for thermal management. These heat pipes, usually 3 or more, are often embedded in a cooper enclosure or block to form a cooling module.

The current designs have an important limitation. Due to their OD sizes, the heat pipes are much comparable with a typical die size. Spreading thermal resistance from the die to each individual heat pipe becomes significant. FIG. 2 shows an illustration of multiple heat pipes embedded in a copper block 200 and coupled to a heat spreader 210. The heat spreader 210 sits on top of a heat source 220, such as a chip. A center heat pipe 230 is positioned closest to the heat source 220, with outer heat pipes 240 located farther away from the heat source 220. The center heat pipe 230 and the outer heat pipes 240 have identical boiling points of 50 degrees Celsius. The spreading thermal resistance causes the outer heat pipes 240 to remove much less heat than the center heat pipe 230. The center heat pipe 230 could reach its boiling limit and exceed its heat removal capacity, causing it to "burn out" before the outer heat pipes 240 have approached their full heat removal potential. Therefore, heat load carried by the outer heat pipes 240 will be far less that the amount carried by heat pipes closer to the heat source, such as the center heat pipe 230. Thus, the center heat pipe 230 will approach and exceed its heat load capacity before the outer heat pipes 240 reach their heat load capacity, resulting in a system poorly adapted for handling high heat load.

What is needed is an apparatus for and method of optimizing boiling points of heat pipes to achieve simultaneous onset of boiling.

SUMMARY OF THE INVENTION

According to a first aspect of the present invention, an apparatus for removing heat from a heat generating device is provided. The apparatus comprises a plate thermally coupled to the heat generating device and thermally coupled to two heat pipes wherein each heat pipe is configured to have a predetermined boiling point temperature selected according to design criteria.

The apparatus can further include a heat spreader. The apparatus can also include one or more additional heat pipes. Preferably, the heat spreader is in thermal contact with the heat generating device and with at least one of the heat pipes. The heat spreader can be made of copper. The heat pipes can differ in boiling point temperature by at least 1 degree Celsius. The heat pipes can differ in outer cross-sectional dimensions depending on thermal distance relative to the heat generating device, such that the heat pipes located a farther thermal distance from the heat generating device have smaller outer cross-sectional dimensions than the heat pipes located a shorter thermal distance from the heat generating device.

According to an alternative embodiment of the present invention, an apparatus for removing heat from a heat generating device by optimizing boiling points of heat pipes in an enclosure is disclosed, wherein the heat pipes have an outer cross-sectional dimension greater than the outer cross-sectional dimension of the heat generating device. The enclosure is coupled to a heat spreader. The apparatus includes a first heat pipe positioned at a first thermal distance from the heat generating device and a second heat pipe positioned at a second thermal distance from the heat generating device, wherein the first heat pipe has a boiling point corresponding to the first thermal distance and the second heat pipe has a boiling point corresponding to the second thermal distance to achieve substantially simultaneous onset of boiling of the heat pipes.

The second heat pipe can be separated by a predetermined from the first heat pipe. The boiling points of heat pipes can be predetermined.

According to another embodiment of the present invention, an apparatus for removing heat from a heat generating device by optimizing boiling points of heat pipes in an enclosure is disclosed. The apparatus includes a first heat pipe positioned at a first thermal distance from the heat generating device; a second heat pipe positioned a second thermal distance from the heat generating device; and means for achieving simultaneous onset of boiling of the heat pipes.

According to another embodiment of the present invention, a method of removing heat from a heat generating device by optimizing boiling of heat pipes in an enclosure is disclosed. The method comprises the steps of: positioning a first heat pipe at a first thermal distance from the heat generating device; providing a second heat pipe positioned at a second thermal distance from the heat generating device; and providing means for achieving simultaneous onset of boiling of the heat pipes.

According to another embodiment of the present invention, an apparatus for removing heat from a heat generating device by optimizing boiling points of heat pipes in an enclosure is disclosed. The apparatus comprises a plurality of heat pipes each having a predetermined thermal distance from the heat generating device wherein a boiling point for each of the plurality of heat pipes is selected in accordance with the thermal distance.

According to another embodiment of the present invention, an apparatus for removing heat from a heat generating device by optimizing boiling points of heat pipes in an enclosure is disclosed. The apparatus comprises a plurality of heat pipes each having a predetermined thermal distance from the heat generating device wherein a boiling point for each of the plurality of heat pipes is selected in accordance with the thermal distance, such that each of the plurality of heat pipes boils at substantially the same time in response to heat generated by the heat generating device.

DETAILED DESCRIPTION OF THE PREFERRED EMBODIMENT

Reference will now be made in detail to the preferred and alternative embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be noted that the present invention may be practiced without these specific details. In other instances, well known methods, procedures and components have not been described in detail as not to unnecessarily obscure aspects of the present invention.

Figure 1:
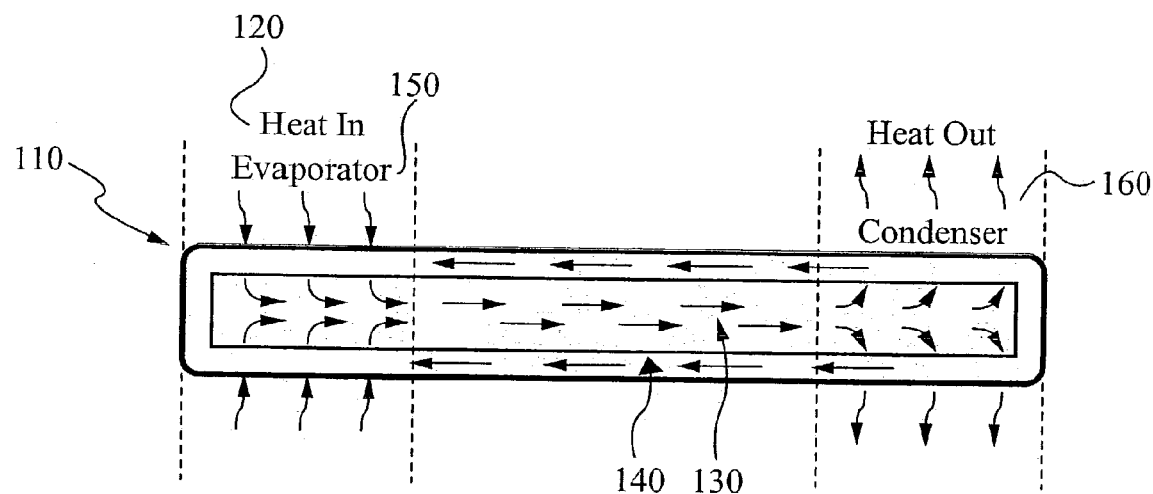
FIG. 1 is a schematic diagram which illustrates how a prior art heat pipe works.
Figure 2:
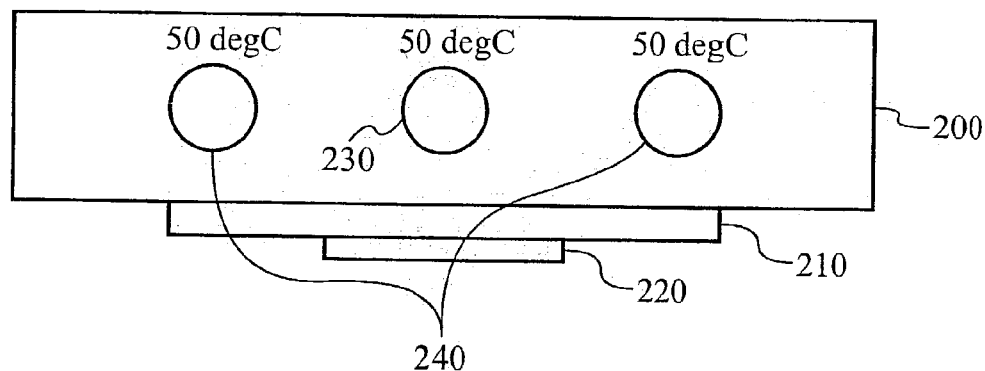
FIG. 2 is a schematic side view prior art illustration of three pipes embedded in a plate having similar boiling points.
Figure 3:
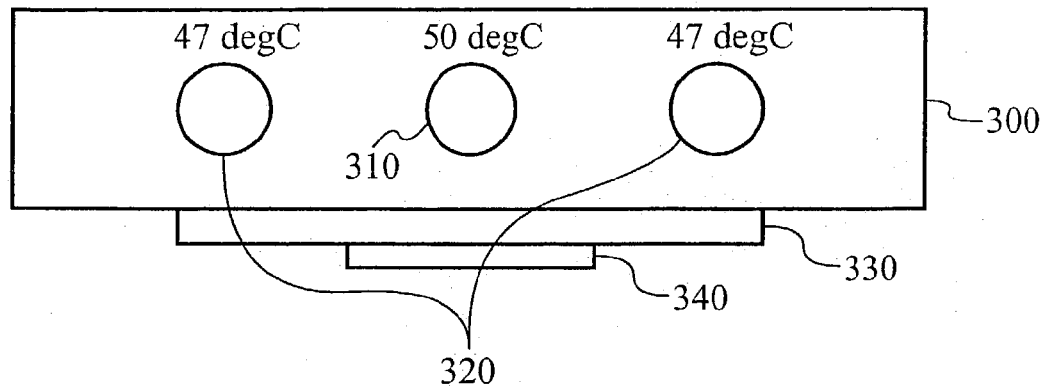
FIG. 3 is a schematic side view of three heat pipes embedded in a plate, with a center heat pipe having a higher boiling point than adjacent heat pipes, in accordance with the present invention.

In accordance with a preferred embodiment of the present invention, an apparatus for removing heat from a heat generating device is shown in a side view of FIG. 3. In particular, the preferred embodiment of this invention includes a first heat pipe 310 and a second or additional heat pipes 320 which are maintained in a fixed spaced-apart position and embedded in a plate 300 constructed of, e.g., copper or aluminum. Cylindrical heat pipes can be placed in holes within the plate 300. The heat pipes 310 and 320 are thermally coupled to a heat generating device 340, such as a chip. A heat spreader 330 is provided to couple the chip to the heat pipes 310 and 320. The heat spreader 330 can be made of solid copper or other heat conductive material. Other designs include heat spreaders within the chip or chip package. The heat spreader 330 helps spread heat generated by the chip at hot-spots on the chip to a much larger area, such as heat pipes. The heat pipes 310 and 320 carry heat away from the heat generating device 340.

The first heat pipe 310 is preferably positioned a first thermal distance from the heat generating device 340. The additional heat pipes 320, adjacent to the first heat pipe 310, are preferably positioned a second thermal distance from the heat generating device 340. The additional heat pipes 320 can be a plurality of heat pipes located a thermal distance from the heat generating device 340.

It will be appreciated that when a heat source in steady state is positioned to provide heat energy to a solid body, eventually the system will reach equilibrium. Because heat can be removed from boundaries of the solid body by convection or radiation or, if it is in contact with other structures heat can be removed by conduction, there will be a temperature gradient across the solid body. The shape, construction and materials of the solid body will determine the difficulty of calculating the equilibrium temperature at any given point in the solid body. For purposes of this document, each point within the solid body that has a same temperature is said to be the same thermal distance from the heat source. By way of example, consider an idealized point heat source at the center of a uniform solid spherical body in space. All points on each concentric sphere having a center at the heat source will be the same temperature and thus the same thermal distance from the heat source.

Still referring to FIG. 3, the first heat pipe 310 has a boiling point corresponding to a first thermal distance from the heat generating device 340. The additional heat pipes 320 have a boiling point corresponding to a second thermal distance from the heat generating device 340 to achieve simultaneous onset of boiling of the heat pipes 310 and 320. The fluid in the additional heat pipes 320 boils at a slightly lower temperature than the center heat pipe 310 to compensate for spreading thermal resistance in the plate 300. Setting the boiling points of the additional heat pipes 320 at a lower temperature compensates for the spreading thermal resistance by inducing an additional temperature drop to force the heat to spread even further. Boiling temperature of the heat pipes 310 and 320 can be fixed by adjusting the pressure inside the heat pipes 310 and 320.

One reason to optimize boiling points of the heat pipes is to ensure that the heat pipes start to boil at approximately same heat load conditions from heat generating devices.

Spreading thermal resistances cause heat pipes located a thermal distance away from the heat generating device to remove less heat than heat pipes located a closer thermal distance to the device. A goal of the present invention is to ensure that all of heat pipes start to boil at approximately similar heat load conditions from the heat generating device, resulting in an optimal and efficient system for handling high heat loads.

Figure 4:
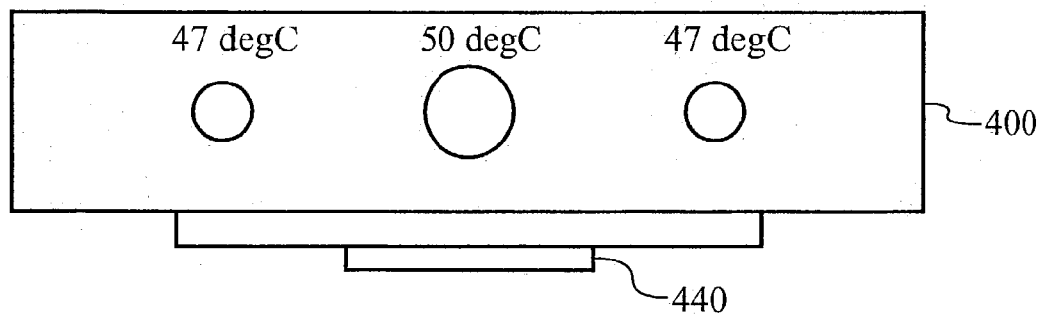
FIG. 4 is a schematic side view of three pipes embedded in a plate, with a center heat pipe having a greater outer cross-sectional dimension than adjacent heat pipes, in accordance with the present invention.

Another goal of the present invention is optimization of heat load capabilities, which correspond to cross-sectional dimensions, of the heat pipes. In FIG. 4, the heat pipes farther from the heat generating device 440 may or may not receive less heat owing to thermal resistances in the plate 400. An optimal heat removal plate may include heat pipes of varying cross-sectional dimensions, such that the heat pipes a farther thermal distance from a heat generating source have smaller cross-sectional dimensions and lower heat removal capability than the heat pipes a closer thermal distance from the heat generating device.

Figure 5:
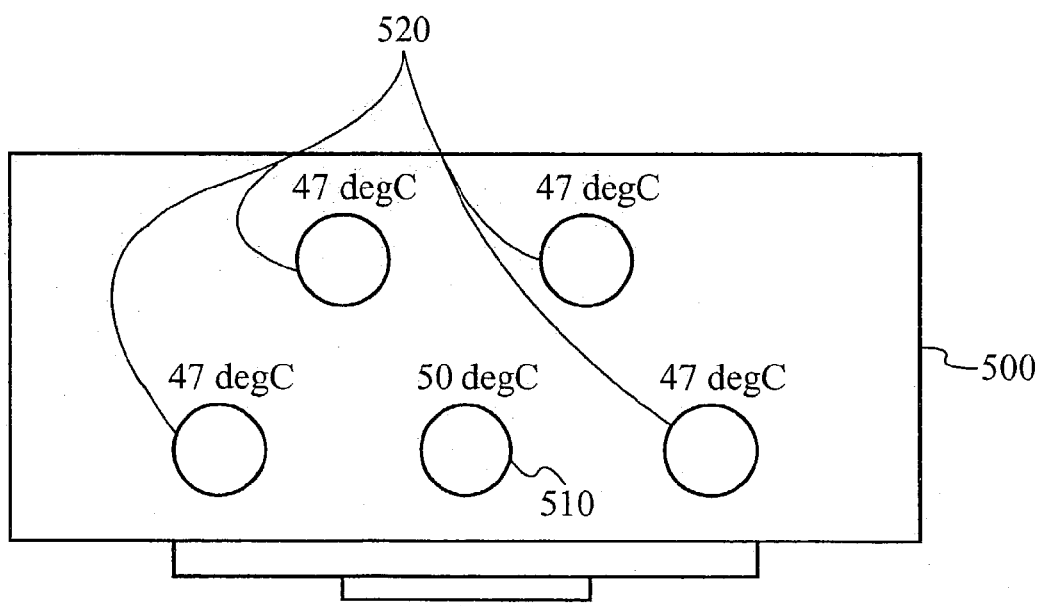
FIG. 5 is a schematic side view of stacked heat pipes embedded in a plate, with a center heat pipe having a higher boiling point than heat pipes a farther thermal distance away from a heat generating device, in accordance with the present invention.

Referring again to FIG. 3, the heat spreader 330 is in thermal contact with the heat generating device 340 and with at least one of the heat pipes 310 and 320. In this example, the first heat pipe 310 can have a boiling point temperature difference of at least 4 degrees, such as a boiling point temperature between 48 degrees Celsius and 52 degrees Celsius. The additional heat pipes 320 can be characterized as having a boiling point temperature difference of at least 10 degrees, such as a boiling point temperature between 37 degrees Celsius and 47 degrees Celsius. To tailor heat toad capabilities, the additional heat pipes 320 can have a lower boiling temperature than the first heat pipe 310. Preferably, the heat pipes 310 and 320 differ in boiling point temperature by at least 1 degree Celsius. Moreover, the additional heat pipes 320 can have a lower heat removal capacity than the heat removal capacity of the first heat pipe 310. As shown in FIG. 3, the additional heat pipes 320 can be separated by a predetermined distance from the first heat pipe 310. Alternatively, heat pipes can be stacked in a plate as shown in FIG. 5. In this example, four outer heat pipes 520 and one center pipe 510 are enclosed in a copper plate. The four outer heat pipes 520 are separated by a predetermined distance and have boiling points lower than the boiling point of the center heat pipe 510. The boiling points of the outer heat pipes 520 can be same or different. The boiling points of all the heat pipes can be predetermined.

Figure 6:
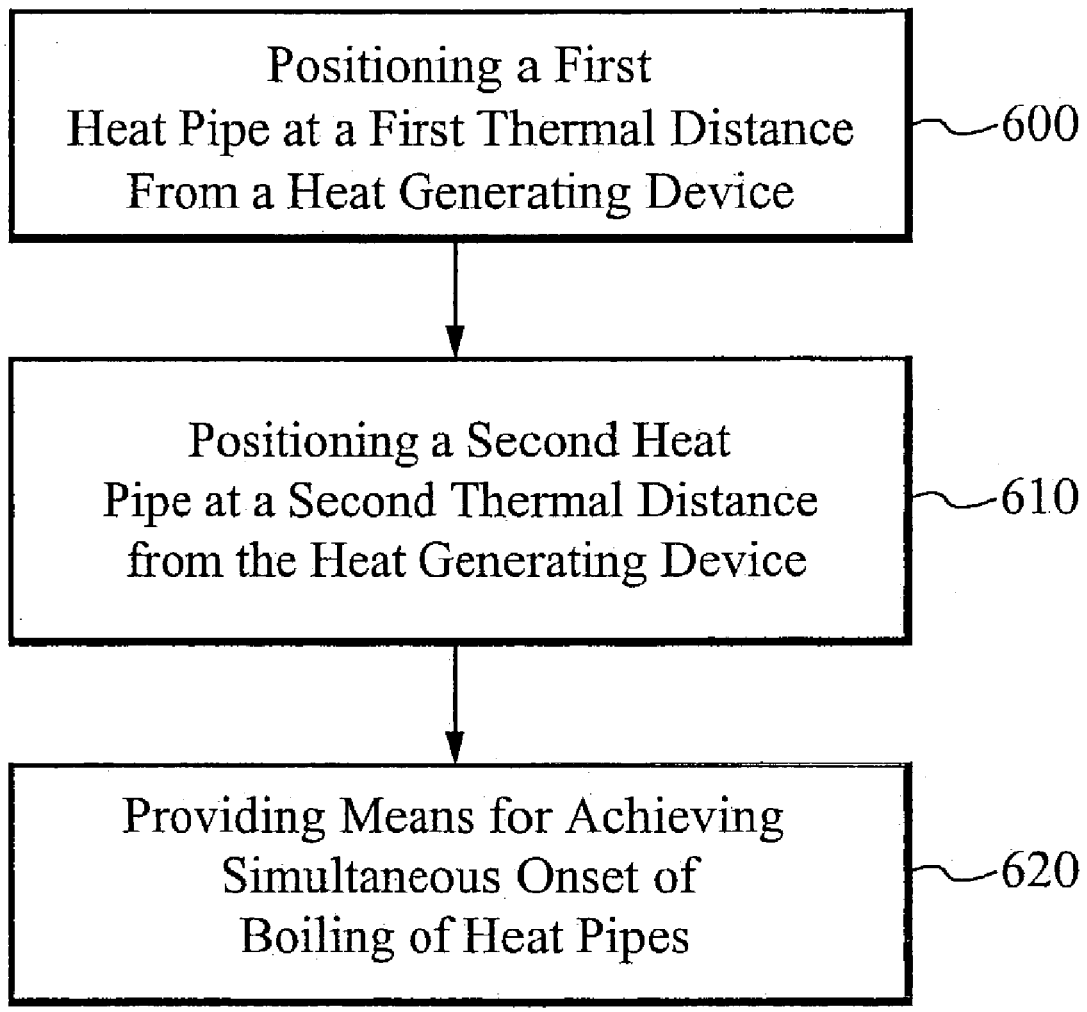
FIG. 6 is a schematic flow chart illustrating steps of a preferred method of the present invention.

In an alternative embodiment, a method of removing heat from a heat generating device by optimizing boiling points of heat pipes in an enclosure is disclosed, as shown in the flow diagram of FIG. 6. In the Step 600, a first heat pipe is positioned at a first thermal distance from a heat generating device. In the Step 610, a second heat pipe is positioned a second thermal distance from the heat generating device. In the Step 620, means for achieving simultaneous onset of boiling of the heat pipes is provided. The first heat pipe can be a center heat pipe and the second heat pipe can be many additional heat pipes or a plurality of heat pipes.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. An apparatus for removing heat from a heat generating device comprising a plate thermally coupled to the heat generating device and thermally coupled to two heat pipes wherein the thermal distances relative to the heat generating device are not the same and wherein each heat pipe is configured to have a predetermined boiling point temperature selected according to design criteria and thermal distance position relative to the heat generating device whereby the boiling point temperatures are not the same, to achieve substantially simultaneous onset of boiling within the two heat pipes in response to heat energy from the heat generating device.

2. The apparatus of claim 1, further including one or more additional heat pipes coupled to the plate.

3. The apparatus of claim 1, further including a heat spreader, wherein the heat spreader is in thermal contact with the heat generating device and with at least one of the heat pipes.

4. The apparatus of claim 1, wherein the heat pipes differing in boiling point temperature by at least 1 degree Celsius.

5. The apparatus of claim 1, wherein the heat pipes differing in outer cross-sectional dimensions depending on the thermal distance position relative to the heat generating device, such that the heat pipes located a farther thermal distance from the heat generating device have smaller outer cross-sectional dimensions than the heat pipes located a shorter thermal distance from the heat generating device.

6. The apparatus of claim 3, wherein the heat spreader is made of copper.

7. An apparatus for removing heat from a heat generating device by optimizing boiling points of heat pipes in an enclosure, the enclosure being coupled to a heat spreader, the apparatus comprising:
   a first heat pipe positioned at a first thermal distance from the heat generating device; and
   a second heat pipe positioned at a second thermal distance from the heat generating device, wherein the first heat pipe has a first boiling point corresponding to the first thermal distance and the second heat pipe has a second boiling point different from the first boiling point and corresponding to the second thermal distance to achieve substantially simultaneous onset of boiling of the heat pipes, wherein the first thermal distance and the second thermal distance are not the same.

8. The apparatus of claim 7, further including one or more additional heat pipes, each additional heat pipe located a thermal distance from the heat generating device.

9. The apparatus of claim 7, wherein the heat spreader is in thermal contact with the heat generating device and with at least one of the heat pipes.

10. The apparatus of claim 7, wherein the heat pipes differing in boiling point temperature by at least 1 degree Celsius.

11. The apparatus of claim 7, wherein the heat pipes differing in outer cross-sectional dimensions depending on thermal distance position relative to the heat generating device, such that the heat pipes located a farther thermal distance from the heat generating device have smaller outer cross-sectional dimensions than the heat pipes located a shorter thermal distance from the heat generating device.

12. The apparatus of claim 7, wherein the second heat pipe is separated by a predetermined distance from the first heat pipe.

13. The apparatus of claim 7, wherein the boiling points of heat pipes are predetermined.

14. The apparatus of claim 7, wherein the heat spreader is made of copper.

15. An apparatus for removing heat from a heat generating device by optimizing boiling points of heat pipes in an enclosure, comprising:
a first heat pipe positioned at a first thermal distance from a heat generating device;
a second heat pipe positioned at a second thermal distance from the heat generating device; and
means for achieving substantially simultaneous onset of boiling of the heat pipes according to thermal distance positions relative to the heat generating device.

16. The apparatus of claim 15, further including one or more additional heat pipes.

17. The apparatus of claim 15, further including a heat spreader, wherein the heat spreader is in thermal contact with the heat generating device and with at least one of the heat pipes.

18. The apparatus of claim 15, wherein the heat pipes differing in boiling point temperature by at least 1 degree Celsius.

19. The apparatus of claim 15, wherein the heat pipes differing in outer cross-sectional dimensions depending on the thermal distance positions relative to the heat generating device, such that the heat pipes located a farther thermal distance from the heat generating device have smaller outer cross-sectional dimensions than the heat pipes located a shorter thermal distance from the heat generating device.

20. The apparatus of claim 15, wherein the second heat pipe is separated by a predetermined distance from the first heat pipe.

21. The apparatus of claim 15, wherein the boiling points of heat pipes are predetermined.

22. The apparatus of claim 17, wherein the heat spreader is made of copper.

23. A method of removing heat from a heat generating device by optimizing boiling points of heat pipes in an enclosure, the method comprising the steps of:
positioning a first heat pipe having a first boiling point at a first thermal distance from the heat generating device; and
positioning a second heat pipe having a second boiling point different from the first boiling point at a second thermal distance from the heat generating device, wherein the first thermal distance and the second thermal distance are not the same for achieving substantially simultaneous onset of boiling of the heat pipes according to thermal distance positions relative to the heat generating device.

24. The method of claim 23, further including one or more additional heat pipes.

25. The method of claim 23, further including a heat spreader, wherein the heat spreader is in thermal contact with the heat generating device and with at least one of the heat pipes.

26. The method of claim 23, wherein the heat pipes differing in boiling point temperature by at least 1 degree Celsius.

27. The method of claim 23, wherein the heat pipes differing in outer cross-sectional dimensions depending on the thermal distance positions relative to the heat generating device, such that the heat pipes located a farther thermal distance from the heat generating device have smaller outer cross-sectional dimensions than the heat pipes located a shorter thermal distance from the heat generating device.

28. The method of claim 23, wherein the second heat pipe is separated by a predetermined distance from the first heat pipe.

29. The method of claim 23, wherein the boiling points of heat pipes are predetermined.

30. The method of claim 23, wherein the heat spreader is made of copper.

31. An apparatus for removing heat from a heat generating device by optimizing boiling points of heat pipes in an enclosure, comprising:
a plurality of heat pipes each having a predetermined thermal distance from the heat generating device wherein the thermal distances of the heat pipes from the heat generating device are not all the same and wherein a boiling point for each of the plurality of heat pipes is selected in accordance with the thermal distance whereby the boiling points are not all the same to achieve substantially simultaneous onset of boiling within the plurality of heat pipes in response to heat energy from the heat generating device.

32. An apparatus for removing heat from a heat generating device by optimizing boiling points of heat pipes in an enclosure, comprising:
a plurality of heat pipes each having a predetermined thermal distance from the heat generating device wherein the thermal distances of the heat pipes from the heat generating device are not all the same and wherein a boiling point for each of the plurality of heat pipes is selected in accordance with the thermal distance whereby the boiling points are not all the same, such that each of the plurality of heat pipes begins to boils at substantially the same time in response to heat generated by the heat generating device.

* * * * *

UNITED STATES PATENT AND TRADEMARK OFFICE
CERTIFICATE OF CORRECTION

| | | |
|---|---|---|
| PATENT NO. | : 7,090,001 B2 | Page 1 of 1 |
| APPLICATION NO. | : 10/440363 | |
| DATED | : August 23, 2006 | |
| INVENTOR(S) | : Peng Zhou et al. | |

It is certified that error appears in the above-identified patent and that said Letters Patent is hereby corrected as shown below:

IN THE BACKGROUND OF THE INVENTION

In column 1, line 58, please replace "cooper" with --copper--.

IN THE SUMMARY OF THE INVENTION

In column 2, line 59, please add the words --thermal distance-- between the words "predetermined" and "from."

IN THE DETAILED DESCRIPTION OF THE PREFERRED EMBODIMENT

In column 5, line 31, please replace "toad" with --load--.

Signed and Sealed this

Twenty-eighth Day of November, 2006

JON W. DUDAS
*Director of the United States Patent and Trademark Office*